United States Patent [19]

McKinnon et al.

[11] Patent Number: 4,868,503
[45] Date of Patent: Sep. 19, 1989

[54] MAGNETIC RESONANCE SPECTROSCOPY METHOD

[75] Inventors: Graeme C. McKinnon, Zurich; Peter Bösiger, Ennetbaden, both of Switzerland

[73] Assignee: U.S. Philips Corporation, New York, N.Y.

[21] Appl. No.: 224,107

[22] Filed: Jul. 26, 1988

[30] Foreign Application Priority Data

Aug. 4, 1987 [DE] Fed. Rep. of Germany ....... 3725800

[51] Int. Cl.$^4$ ........................................... G10R 33/20
[52] U.S. Cl. .................................................. 324/309
[58] Field of Search ................ 324/307, 309, 311, 312

[56] References Cited

U.S. PATENT DOCUMENTS 4,771,242 9/1988 Lampman et al. .................. 324/309

OTHER PUBLICATIONS

Sehgal et al., "Correlative Study . . . Magnetic Resonance", Magn. Res. in Med., 3, 976-985, 1986.
W. P. Aue et al., Volume-Selective Excitation. A Novel Approach to Topical NMR JMR 56, 350-354, (1984), No. 2, Feb.
D. A. Lampman et al., Improvements to Volume Selective $^1$H Spectroscopy With Solvent Suppression, SMRM 1986, Book of Abstracts, pp. 981-982.
N. Chandrakumar, Modern Techniques in High-Resolution FT-NMR, Springer-Verlag, New York Inc., (1987), pp. 110, 112, 113.
W. F. Aue et al., J. Chem. Phys., vol. 64, No. 10, May 15, 1976, pp. 4226, 4227.

Primary Examiner—Stewart J. Levy
Assistant Examiner—Kevin D. O'Shea
Attorney, Agent, or Firm—Thomas A. Briody; Jack E. Haken; Jack D. Slobod

[57] ABSTRACT

The invention relates to a volume selective magnetic resonance spectroscopy method. Volume selection is performed after excitation by means of three layer-selective 180° rf pulses which excite the nuclear magnetization in three mutually perpendicular layers. The distance between the three selective 180° rf pulses can be chosen to be as small as possible.

1 Claim, 2 Drawing Sheets

MAGNETIC RESONANCE SPECTROSCOPY METHOD

BACKGROUND OF THE INVENTION

1. Field of the Invention

The invention relates to a magnetic resonance spectroscopy method where an examination zone is subjected to a plurality of sequences, each sequence comprising at least two rf pulses, the distance in time between the rf pulses or their phase or their amplitude being varied from one sequence to another.

2. Description of the Related Art

A method of this kind is known inter alia from J. Chem. Phys., Vol. 64, No. 10, May 15, 1976, pages 4226 to 4227. Therein, each sequence consists of a 90° rf pulse and a 180° rf pulse whose distance in time is varied from one sequence to another. From the echo signals occurring subsequent to the 180° rf pulses there is derived a two-dimensional Fourier spectrum, the transformation parameter for one frequency axis being the variation in time of the signals whilst that for the other frequency axis is formed by the distance in time.

Also known are spectroscopy methods where the composition of the sequences is different and/or where, instead of the distance in time of the rf pulses, their amplitude or phase position is varied from one sequence to another. These methods also enable a two-dimensional spectrum to be obtained by means of two-dimensional Fourier transformation.

On the other hand, sequences of the kind set forth are also suitable for performing so-called multiple quantum experiments where higher quantum coherences are excited by the rf pulses.

In medicine there is a need for spatial resolution spectroscopy (Tropical Magnetic Resonance) where only a strictly defined examination zone (for example, a complete organ) is subjected to spectroscopic analysis. To this end it is known (J. Mag. Reson. 56, pages 350 to 354 (1984)) to select the volume to be excited before the spectroscopic excitation by sustaining the nuclear magnetization within the region of interest, the nuclear magnetization being rotated through 90° and subsequently dephased outside this region, so that it can no longer make a signal contribution. The region to be selected is defined in that three mutually perpendicular layers are excited, each layer involving a selective 45° pulse, a 90° wideband pulse and a further 45° rf pulse in the presence of a magnetic gradient field. The spectroscopic excitation is subsequently performed by means of a single rf pulse.

This known method for volume selection, however, influences the subsequent spectroscopic excitation so that it is not suitable for two dimensional spectroscopy, and notably not for multiple quantum experiments.

SUMMARY OF THE INVENTION

It is an object of the present invention to propose a method suitable for two-dimensional spectroscopy or multiple quantum experiments so that spatial resolution (two-dimensional) spectroscopy is possible.

This object is achieved in accordance with the invention in that at the end of each sequence there are generated three 180° rf pulses, during each of these rf pulses there being activated a magnetic gradient field with a gradient extending each time in one of three mutually perpendicular directions. Thus, in accordance with the invention the volume selection takes place subsequent to the spectroscopic excitation by three layer-selective 180° rf pulses which influence the nuclear magnetization in three mutually perpendicular layers. At the area of intersection of these three layers, the three 180° rf pulses act as a single 180° rf pulse which rephases the nuclear magnetization in the excited region, without, however, influencing the spin spin interactions and the quantum coherences. Preferably, the resonance signals are evaluated which occur approximately at the instant at which the nuclear magnetization has been rephased. A further advantage consists in that the distance between the rf pulses can be selected independently from their distance from the preceding pulse or pulses of the sequence. When the last one of the non-selective rf pulses used for the spectroscopic excitation is a 180° rf pulse, it can be omitted. Its effect on the selected volume is taken over by that of one of the three layer selective 180° rf pulses.

It is to be noted that from "Book of Abstracts" of S.M.R.M., Vol. 3, 1986, pages 981 and 982, there is already known a volume-selective spectroscopy method where a binomial 90° rf pulse is followed by three layer-selective 180° rf pulses. This concerns a Carr-Purcel sequence where the three 180° pulses succeeding the 90° pulse are layer-selective. The distance between two neighbouring 180° rf pulses must then amount to twice the distance between the first 180° pulse and the binomial 90° rf pulse. It is also a drawback that the method cannot provide a two-dimensional spectrum.

BRIEF DESCRIPTION OF THE DRAWINGS

The invention will be described in detail hereinafter with reference to the drawing. Therein.

DESCRIPTION OF THE PREFERRED EMBODIMENTS

Figure 1:
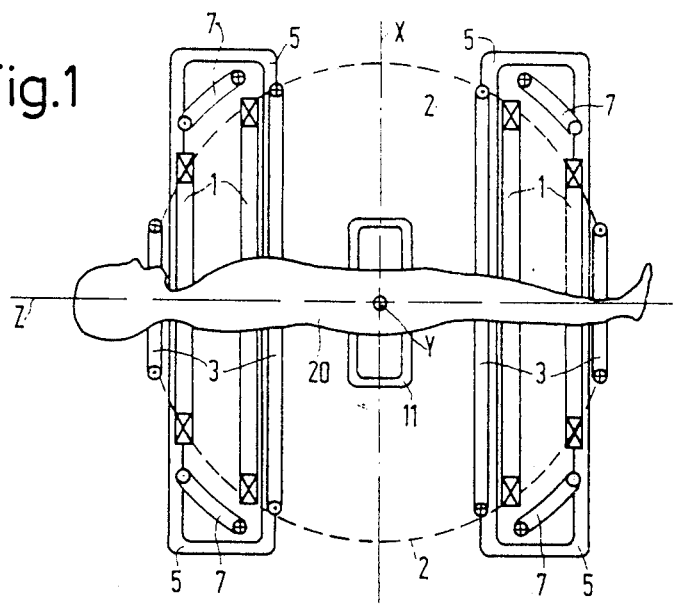
FIG. 1 shows an apparatus for medical magnetic resonance examinations which is suitable for performing the method in accordance with the invention.

The magnetic resonance examination apparatus which is diagrammatically shown in FIG. 1 comprises a system which consists of four coils 1 for generating a steady, uniform magnetic field which may be in the order of magnitude of some tenths of T to some T. This field extends in the z-direction of a cartesian coordinate system. The coils 1 are arranged concentrically with respect to the z-axis and can be provided on a spherical surface 2. The patient 20 to be examined is arranged within these coils.

In order to generate a magnetic field Gz which extends in the z direction and which varies linearly in this direction there are provided four coils 3, preferably on the same spherical surface. There are also provided four coils 7 which generate a magnetic gradient field (i.e. a magnetic field whose strength linearly varies in one direction) Gz which also extends in the z-direction but whose gradient extends in the x-direction. A magnetic gradient field Gy which extends in the z-direction with a gradient in the y-direction is generated by four coils 5 which may have the same shape as the coils 7 but which are arranged so as to be rotated through 90° with respect thereto. FIG. 1 shows only two of these four coils.

Because each of the three coil systems 3, 5 and 7 for generating the magnetic gradient fields Gz, Gy and Gx is symmetrically arranged with respect to the spherical surface 2, the field strength at the centre of the sphere, being at the same time the origin of said cartesian xyz coordinate system, is determined only by the steady, uniform magnetic field of the coil system 1. Furthermore, an rf coil 11 is symmetrically arranged with respect to the plane z=0 of the coordinate system, which rf coil is constructed so that it generates an essentially uniform rf magnetic field which extends in the x-direction, i.e. perpendicularly to the direction of the steady, uniform magnetic field. The rf coil receives an rf modulated current from an rf generator during each rf pulse. After three rf pulses, the rf coil 11 serves for the reception of the echo signal generated in the examination zone. However, use can alternatively be made of a separate rf receiver coil.

Figure 2:
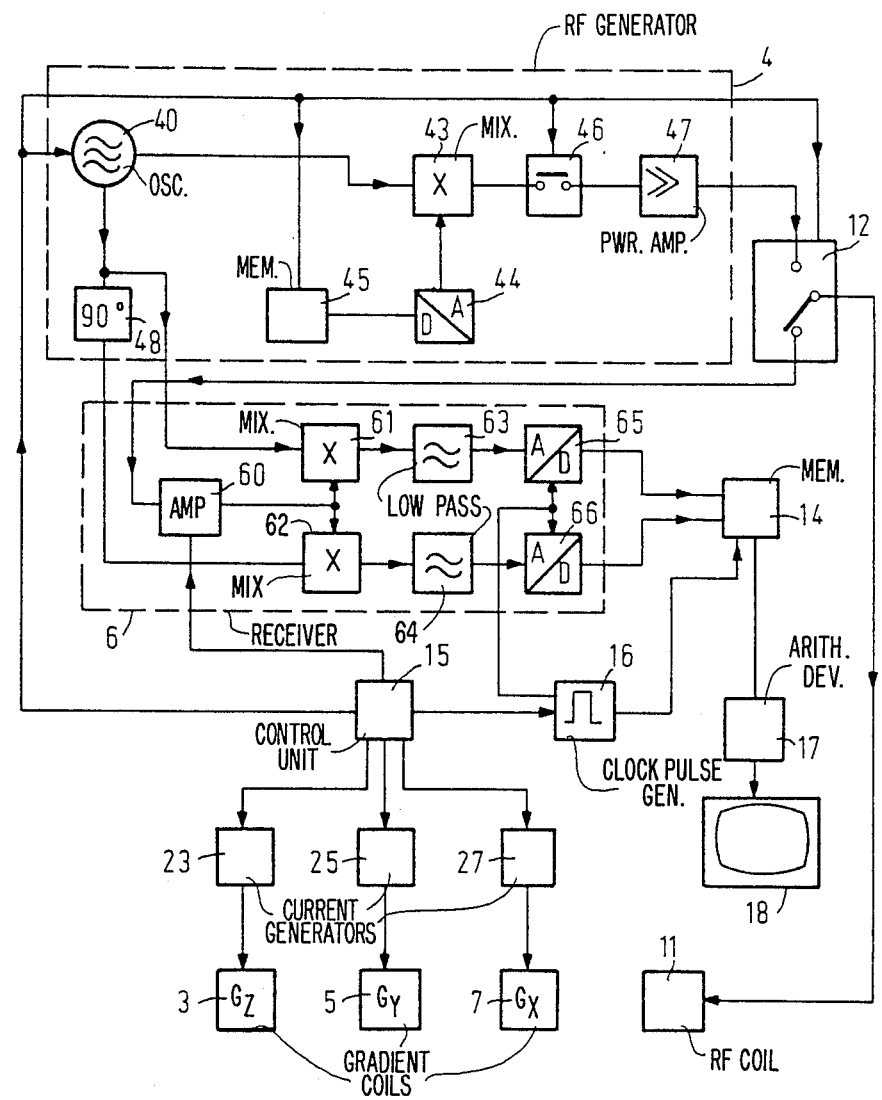
FIG. 2 shows a block diagram of such an apparatus.

FIG. 2 shows a simplified block diagram of this magnetic resonance examination apparatus. Via a switching device 12, the rf coil 11 is connected to an rf generator 4 on the one side and to an rf receiver 6 on the other side.

The rf generator 4 comprises an rf oscillator 40 whose frequency can be digitally controlled and which supplies oscillations having a frequency equal to the Larmor frequency of the nuclei to be excited at the field strength generated by the coils 1. The Larmor frequency f is calculated in known manner according to f =cB, where B is the magnetic induction in the steady uniform magnetic field and c is the gyromagnetic ratio which, for example for protons, amount to 42.56 MHz/T. The output of the oscillator 40 is connected to an input of a mixing stage 43. The mixing stage 43 receives a second input signal from a digital-to-analog converter 44 whose output is connected to a digital memory 45. Under the control of a control device 15, a series of digital data words which represent an envelope signal is read from the memory.

The mixing stage 43 processes the input signal applied thereto so that the carrier oscillation modulated by the envelope signal appears on its output. The output signal of the mixing stage 43 is applied, via a switch 46 which is controlled by the control unit 15, to an rf power amplifier 47, the output of which is connected to the switching device 12. This switching device is also controlled by the control unit 15.

The receiver 6 comprises an rf amplifier 60 which is connected to the switching device and which receives the echo signal induced in the rf coil 11, for this purpose the switching device much occupy the appropriate position. The amplifier 60 comprises a muting input which is controlled by the control device 15 and via which it can be blocked so that the gain is substantially zero. The output of the amplifier is connected to the first inputs of two multiplying mixing stages 61 and 62, each of which supplies an output signal which corresponds to the product of its input signals. The second inputs on the mixing stages 61 and 62 receive a signal having the frequency on the oscillator 40, a phase shift of 90° existing between the signals on the two inputs. This phase shift is produced by means of a 90° phase shifter 48 whose output is connected to the input of the mixing stage 62 and whose input is connected to the input of the mixing stage 61 and to the output of the oscillator 40.

The output signals of the mixing stages 61 and 62 are applied, via lowpass filters 63 and 64 which suppress the frequency supplied by the oscillator 40 as well as all frequencies exceeding the oscillator frequency and which conduct lower frequency components, to a respective analog-to-digital converter 65, 66. These converters convert the analog signals of the circuit 61 ... 64 forming a quadrature demodulator, into digital data words which are applied to a memory 14. The analog-to-digital converters 65 and 66 as well as the memory 14 receive their clock pulses from a clock pulse generator 16 which can be blocked and released by the control unit 15, via a control lead, so that the signals supplied by the rf coil 11 and transposed to the lower frequency range, can be converted into a series of digital data words for storage in the memory 14 only during a measuring interval defined by the control device 15.

The three coil systems 3, 5 and 7 receive a respective current from the current generators 23, 25 and 27; the variation in time can be controlled by the control unit 15. The data words or sampling values stored in the memory 14 are applied to an arithmetic device 17 which determines a two-dimensional spectrum of the nuclear magnetization therefrom by means of two-dimensional discrete Fourier transformation, and which outputs this spectrum to a suitable reproduction unit, for example a monitor 18.

Figure 3:
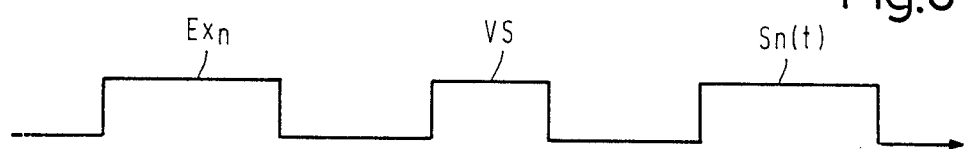
FIG. 3 shows the position in time of the signals for spectroscopy and volume selection as well as the resonance signal.
Figure 4A:
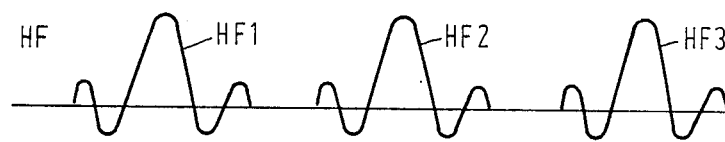
FIGS. 4a–4d show the variation in time of the pulses required for volume selection.
Figure 4B:
Figure 4C:
Figure 4D:
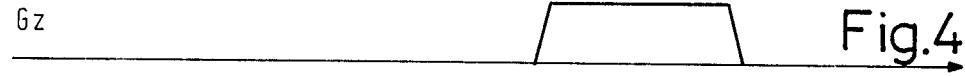

As appears from FIG. 3, each sequence comprises a first sub-sequence Exn which comprises at least two rf pulses whose distance from one another or whose phase position or amplitude is varied from one sequence to another. An example of such a spectroscopic sub-sequence is described in the cited document J. Chem. Phys., Vol. 64, No. 10, May 15, 1976, pages 4426 and 4427. This sub-sequence consists of a 90° rf pulse and a 180° rf pulse, it being possible for the 180 rf pulse to be omitted as has already been stated. Other examples of such sub-sequences and sub-sequences which are suitable for multiple quantum experiments are described in the book by N. Chandrakumar and S. Subramanian "Modern Techniques in High-Resolution FT-NMR", Springerverlag, N.Y. (1987).

In this phase energy is supplied only to the rf coil 11; the current generators 23 ... 27 are switched off so that no magnetic gradient fields can be generated.

The sub-sequence Exn is followed by a sub-sequence VS which serves for volume selection. In this phase, to be described in detail hereinafter, the rf coil 11 as well as the gradient coils 3, 5 and 7 periodically receive energy. The sub-sequence VS realizes on the one hand rephasing of the nuclear magnetization and on the other hand volume selection. It is succeeded by a time interval during which the echo signal Sn(t) is sampled. During this interval the switch 12 is in the positio shown in FIG. 2 (contrary to the two preceding time intervals); moreover, the clock pulse generator 16 is released by the control device 15 so that the signals transposed to the low frequency range and received by the rf coil are converted into a series of digital data words which are stored in the memory 14.

FIGS. 4a to 4d show the variation in time of the second sub-sequence VS. This second sub-sequence comprises three, (preferably equally spaced) successive 180° rf pulses HF1, HF2, HF3. During the first rf pulse the current generator 27 is switched on, which generator supplies a current through the gradient coils 7 so that a magnetic gradient field Gx with a gradient in the x direction is generated. As a result, the nuclear magnetization is inverted in a layer which extends perpendicularly to the x axis and whose thickness depends on the bandwidth of the first 180° rf pulse HF1 and on the magnitude of the gradient and whose position depends on the central frequency of the pulse HF1. The nuclear magnetization outside the layer is dephased by the magnetic gradient field Gx.

During the second 180° rf pulse HF2 the current generator 25 is switched on, which generator supplies a current through the gradient coils 5. As a result, a magnetic gradient field Gy with a gradient in the y direction is generated. In conjunction with the second rf pulse HF2 this gradient field dephases the nuclear magnetization in a layer extending perpendicularly to the y-axis. The position of this layer on the y axis is determined by the frequency of the pulse HF2 and its thickness is determined by the bandwidth of the pulse HF2 and the magnitude of the gradient. After the second rf pulse, therefore, the nuclear magnetization has been dephased everywhere outside the area of intersection of the two layers; renewed inversion is obtained only at the area of intersection of the two layers, so that the state of the nuclear magnetization is the same as before the first rf pulse HF1.

During the third 180° rf pulse HF3 the current generator 23 is switched on so that a current flows through the gradient coils 3, a magnetic gradient field Gz thus being generated with a gradient in the z-direction. As a result, the nuclear magnetization is inverted in a layer extending perpendicularly to the z axis and is dephased outside this layer. The position and the thickness of the layer are determined by the frequency and the bandwidth of the rf pulse and the magnitude of the gradient. Because only the nuclear magnetization in said area of intersection has not yet been dephased, prior to the third rf pulse HF3, the nuclear magnetization in the volume element in which the three said layers intersect will have been inverted after the third rf pulse; everywhere outside this volume element the nuclear magnetization has been dephased by the magnetic gradient fields. In order to intensify the dephasing outside the selected volume, it is advantageous to activate the magnetic gradient field Gx, Gy or Gz already a period of time before the rf pulse HF1, HF2 or HF3, and to deactivate it only a corresponding period of time thereafter, the gradient then preferably being larger than during the relevant rf pulse. The time integral over the magnetic gradient field to the instant of activation of this field to the centre of the rf pulse must be exactly equal to that from the centre of the pulse and the instant of deactivation of the field. This "spoiling" of the magnetic gradient field has no effect on the dimensions of the selected volume, because it acts outside the rf pulses. Moreover, it dephases spin coherences which change their quantum state during multiple quantum experiments.

Thus the three rf pulses HF1 ... HF3, in conjunction with the magnetic gradient fields Gx ... Gz, act on the volume element as a single 180° pulse whose position in time corresponds, when the distance between the rf pulses is the same, to that of the second 180° rf pulse which rephases the nuclear magnetization in this volume element again. The echo signal received at the appropriate distance in time after the three rf pulses HF1 ... HF3, i.e. approximately at the instant of rephasing, is thus determined exclusively by the material composition of this volume element; it is to be noted that the variation in time of the echo signal is not influenced by the volume selection.

Contrary to a Carr-Purcel sequence, in accordance with the invention the distance in time between the individual rf pulses HF1 ... HF3 need not amount to twice the distance in time between the first rf pulse and the (last) rf pulse of the sub-sequence Exn. It is usually advantageous when the distance between the rf pulses is smaller, for example small in comparison with the distance from the last rf pulse of the sub-sequence Exn. For a predetermined sampling interval, symmetrically situated with respect to the rephasing instant for the echo signal (Sn(t)), this leads to shorter echo times and hence to an improved signal-to-noise ratio. On the other hand, for a predetermined echo time the distance in time between the gradient field linked to the rf pulse HF3 and the echo signal Sn(t) is increased, thus reducing the eddy current effects caused by this gradient field. Moreover, spin echo signals cannot occur between the three 180° rf pulses HF1 ... HF3.

What is claimed is:

1. A magnetic resonance spectroscopy method in which an examination zone is subjected to successive sequences, each sequence comprising at least two r.f. pulses, a distance between the at least two r.f. pulses or their phase or their amplitude being varied from one sequence to another, at least the first pulse of the at least r.f. pulses being an excitation pulse, characterized in that at the end of each sequence there are generated three successive 180 degree r.f. pulses and there are activated three magnetic gradient fields with a gradient extending each time in a different one of three mutually perpendicular directions, such that the sequences comprise three selective r.f. pulses at the end thereof, and in that the distances in time between the selective 180 degree r.f. pulses are substantially smaller than the distance in time between the last excitation pulse and a first selective 180 degree pulse.

* * * * *